United States Patent
Hanya

(10) Patent No.: US 11,355,684 B2
(45) Date of Patent: Jun. 7, 2022

(54) MULTILAYER CIRCUIT SUBSTRATE AND MANUFACTURING METHOD THEREOF

(71) Applicant: STANLEY ELECTRIC CO., LTD., Tokyo (JP)

(72) Inventor: Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 136 days.

(21) Appl. No.: 16/400,913

(22) Filed: May 1, 2019

(65) Prior Publication Data
US 2019/0355889 A1  Nov. 21, 2019

(30) Foreign Application Priority Data

May 17, 2018  (JP) .............................. JP2018-095493

(51) Int. Cl.

| H01L 33/62 | (2010.01) |
| H01L 23/528 | (2006.01) |
| H01L 23/522 | (2006.01) |
| H05K 3/12 | (2006.01) |
| H05K 1/09 | (2006.01) |
| H01L 33/00 | (2010.01) |
| H01L 33/52 | (2010.01) |

(52) U.S. Cl.
CPC ............ *H01L 33/62* (2013.01); *H01L 23/528* (2013.01); *H01L 23/5226* (2013.01); *H01L 33/005* (2013.01); *H01L 33/52* (2013.01); *H05K 1/097* (2013.01); *H05K 3/12* (2013.01); *H05K 3/1283* (2013.01)

(58) Field of Classification Search
CPC ..... H01L 33/62; H01L 33/005; H01L 23/528; H01L 23/5226; H01L 33/52; H05K 3/1283; H05K 1/097; H05K 3/12
See application file for complete search history.

(56) References Cited

U.S. PATENT DOCUMENTS 9,896,546 B2  2/2018 Shimoda et al.

FOREIGN PATENT DOCUMENTS

| JP | 2004103739 A | 4/2004 |
| JP | 2014185358 A | 10/2014 |
| JP | 2017069586 A | 4/2017 |
| WO | 2016170902 A1 | 10/2016 |
| WO | WO-2016170901 A1 * | 10/2016 ............... H05K 3/00 |

OTHER PUBLICATIONS

Japanese Office Action (and English language translation thereof) dated Feb. 1, 2022, issued in counterpart Japanese Application No. 2018-095493.

\* cited by examiner

*Primary Examiner* — Hoang-Quan Ho
(74) *Attorney, Agent, or Firm* — Holtz, Holtz & Volek PC

(57) ABSTRACT

An aspect of the invention provides a multilayer circuit substrate that has a simple configuration and is thin. The multilayer circuit substrate has a stacked multiple of substrates and a wiring pattern disposed so to be sandwiched between the stacked multiple of substrates. At least one portion of the wiring pattern is configured of a conductive material wherein conductive particles are sintered. An upper face of the wiring pattern is directly joined to the substrate positioned above the wiring pattern, a lower face of the wiring pattern is directly joined to the substrate positioned below the wiring pattern, and the stacked multiple of substrates are fixed to each other by the wiring pattern.

1 Claim, 8 Drawing Sheets

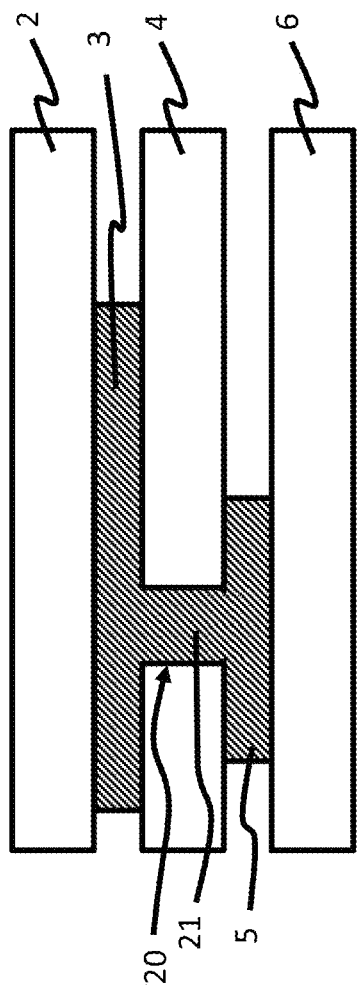

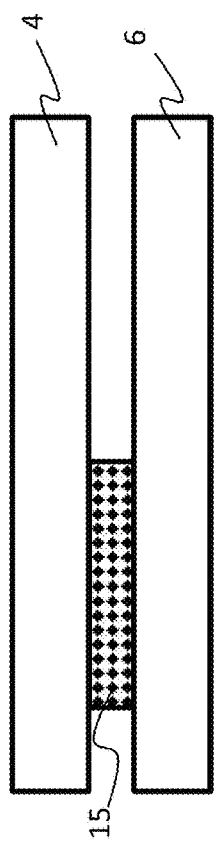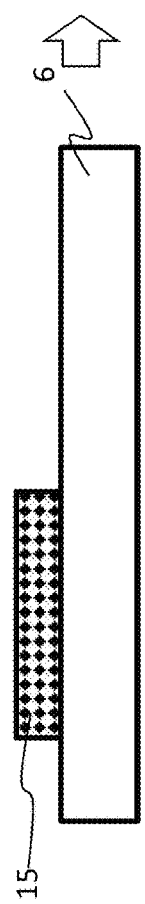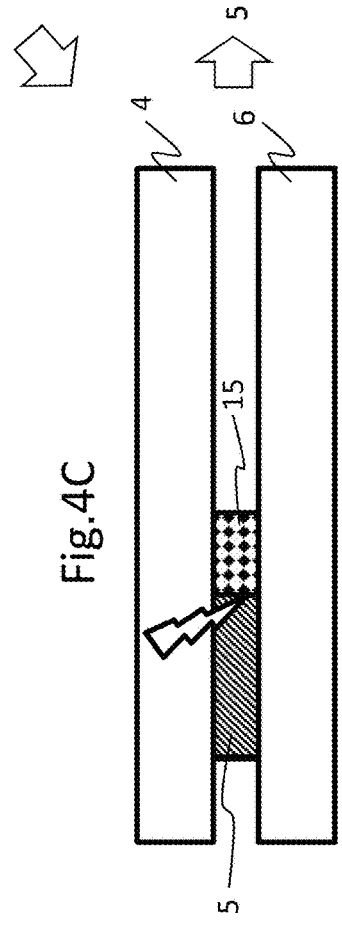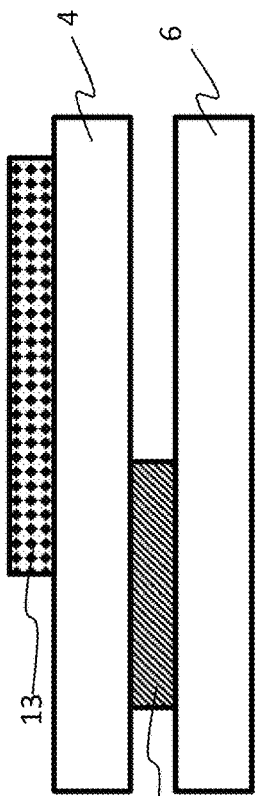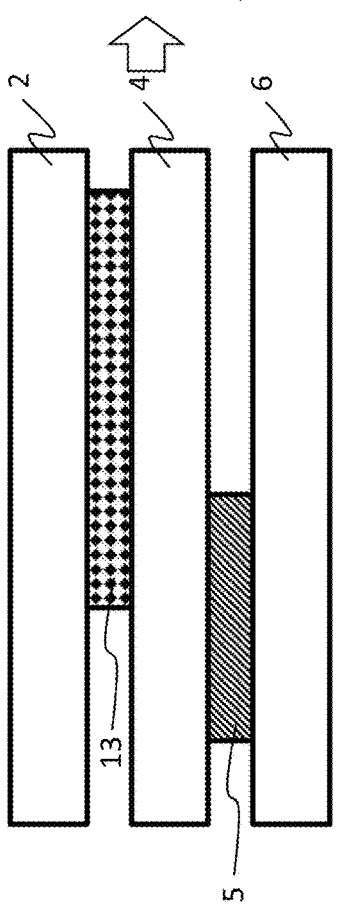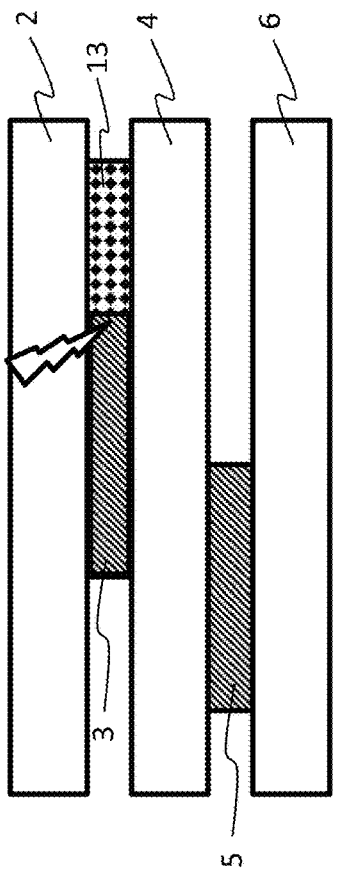

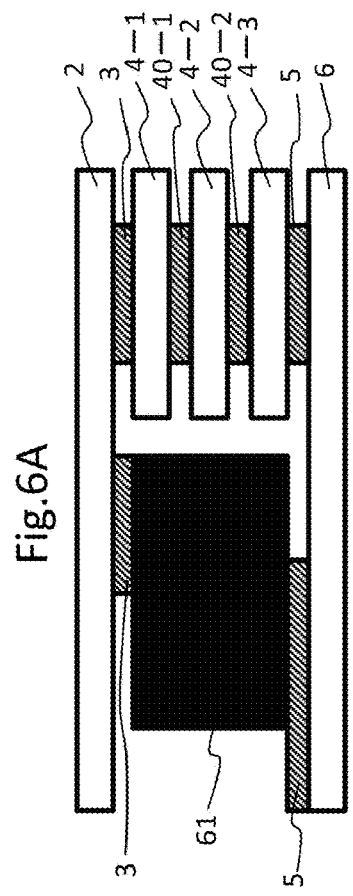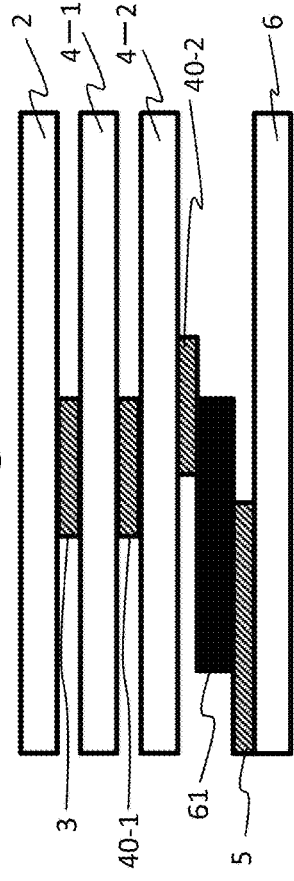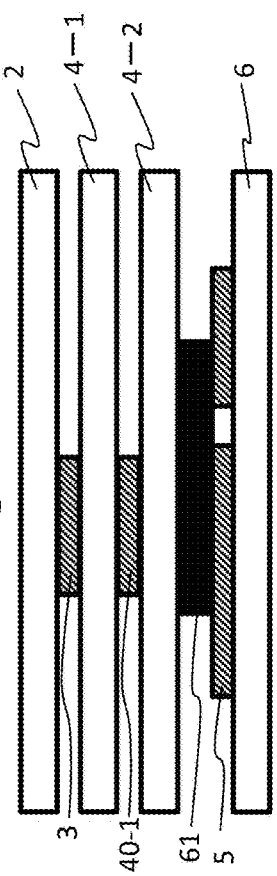

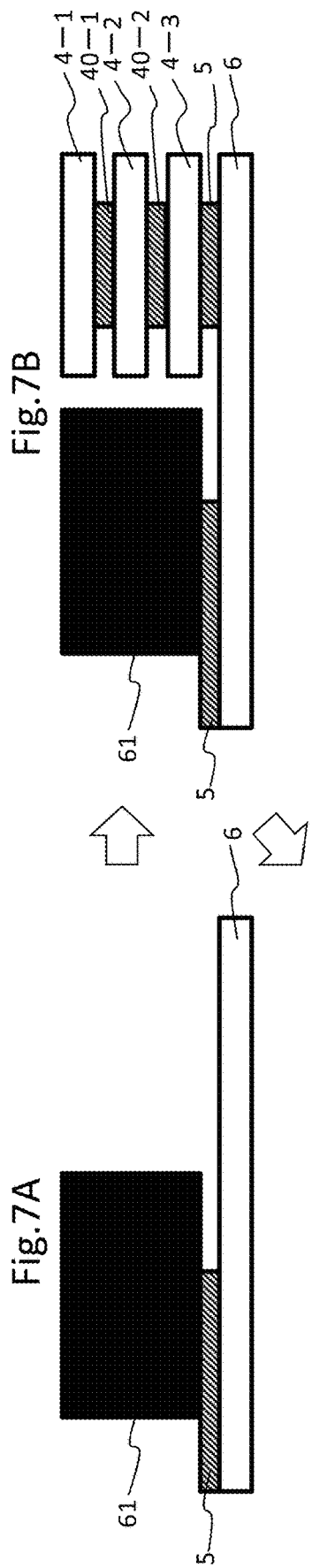

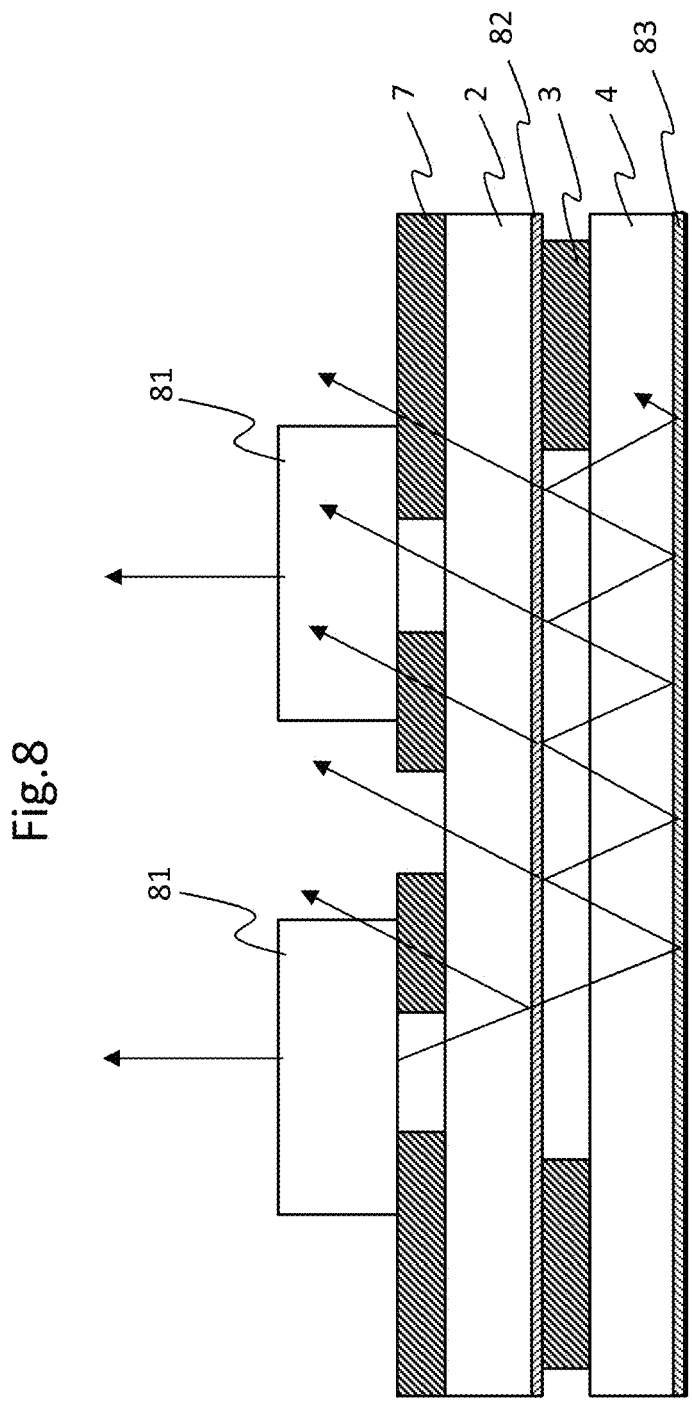

MULTILAYER CIRCUIT SUBSTRATE AND MANUFACTURING METHOD THEREOF

BACKGROUND OF THE INVENTION

Field of the Invention

The present invention relates to a multilayer circuit substrate of a structure wherein a multiple of substrates are stacked sandwiching a wiring pattern.

Description of the Background Art

A method such that copper foil processed in advance into a desired wiring pattern is stacked on a core material sandwiching a semi-cured resin layer called a prepreg, after which the prepreg is cured by heating, is known as an existing multilayer circuit substrate manufacturing method. According to this method, the prepreg forms an adhesive layer and an insulating layer, and the copper foil can be stacked on the core material. The copper foil, the prepreg, and the core material are each of a thickness such that the copper foil, the prepreg, and the core material can be transported and processed in single layers, because of which reducing a thickness of the multilayer circuit substrate is difficult.

Also, a method described in, for example, JP-A-2017-69586 is known as another multilayer circuit substrate manufacturing method. This method is such that a layer is formed by a conductive layer of copper foil or the like being coated with a resin composition, and a conductive layer is further affixed onto the resin composition layer, after which a resist layer is formed on the conductive layer, and a through hole is formed in the resin composition layer, using the resist layer as a mask. After the resin composition layer is cured by heating, a metal layer is formed on an inner wall of the through hole using plating or the like. Furthermore, the conductive layer is patterned, thereby forming a desired wiring pattern. A resin layer and a conductive layer are further formed on the conductive layer, and a through hole formation and a conductive layer patterning are carried out. By these processes being repeated, a multilayer circuit substrate can be formed.

The multilayer circuit substrate manufacturing method of JP-A-2017-69586 is such that a process of forming a layer by coating a conductive layer such as copper foil with a semi-cured resin composition, a process of patterning the layer of the conductive layer and the resin composition, a process of plating a through hole, a process of curing the resin composition layer, and the like, are repeated for each layer, and conductive layers and resin layers are stacked sequentially, because of which a manufacturing process is complex. Also, a large-scale manufacturing device is needed for each of an etching and a plating.

Also, the manufacturing method of JP-A-2017-69586 is such that copper foil is coated with a resin composition, because of which a thickness of the copper foil needs to be a thickness of an extent that the copper foil can be coated with the resin composition, the resin composition after coating can be held, and transporting and fixing for an etching process, a plating processing, or the like can be carried out. Because of this, it is difficult to manufacture a multilayer circuit substrate with a thickness of 100 μm or less using the manufacturing method of JP-A-2017-69586.

SUMMARY OF THE INVENTION

An object of the invention is to provide a multilayer circuit substrate that has a simple configuration and is thin.

In order to achieve the heretofore described object, according to an aspect of the invention, a multilayer circuit substrate having a stacked multiple of substrates and at least one layer of wiring pattern disposed so to be sandwiched between the stacked multiple of substrates, wherein at least one portion of the wiring pattern is configured of a conductive material wherein conductive particles are sintered, is provided. An upper face of the wiring pattern is directly joined to the substrate positioned above the wiring pattern, a lower face of the wiring pattern is directly joined to the substrate positioned below the wiring pattern, and the stacked multiple of substrates are fixed to each other by the wiring pattern.

According to the aspect of the invention, a stacked multiple of substrates are fixed to each other by a wiring pattern wherein conductive particles are sintered, because of which a multilayer circuit substrate is of a simple configuration, and a thickness thereof can be reduced.

BRIEF DESCRIPTION OF THE DRAWINGS

FIG. 2 is a sectional view of the multilayer circuit substrate including a through hole in the first embodiment;

FIGS. 4A to 4F are illustrations showing a process of manufacturing the multilayer circuit substrate of FIG. 1C;

FIGS. 6A to 6C are each a sectional view of a multilayer circuit substrate in which an electronic part is mounted in a second embodiment;

FIGS. 7A to 7D are illustrations showing a process of manufacturing the multilayer circuit substrate of FIG. 6A; and FIG. 8 is a sectional view of a multilayer circuit substrate including an LED die, a mirror, and the like in a third embodiment.

DETAILED DESCRIPTION OF THE INVENTION

An embodiment of the invention will be described, using the drawings.

First Embodiment

Figure 1A:
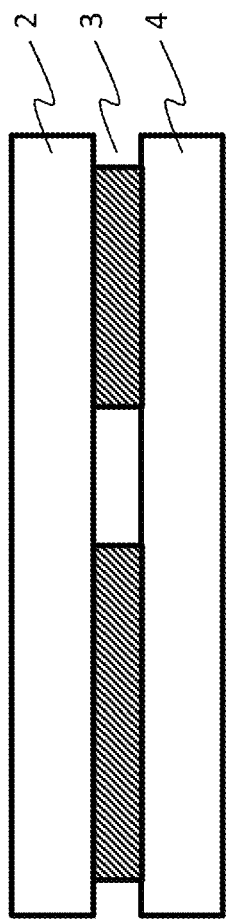
FIGS. 1A to 1C are each a sectional view of a multilayer circuit substrate of a first embodiment.

A multilayer circuit substrate of a first embodiment has a stacked multiple of substrates 2 and 4, and a wiring pattern 3 disposed so as to be sandwiched between the stacked substrates 2 and 4, as shown as an example in a sectional view in FIG. 1A. At least one portion of the wiring pattern 3 is configured of a conductive material wherein conductive particles are sintered. An upper face of the wiring pattern 3 is joined directly to the substrate 2 positioned above the wiring pattern 3, and a lower face of the wiring pattern 3 is joined directly to the substrate 4 positioned below the wiring pattern 3. Because of this, the stacked multiple of substrates 2 and 4 are fixed to each other by the wiring pattern 3.

Figure 1B:
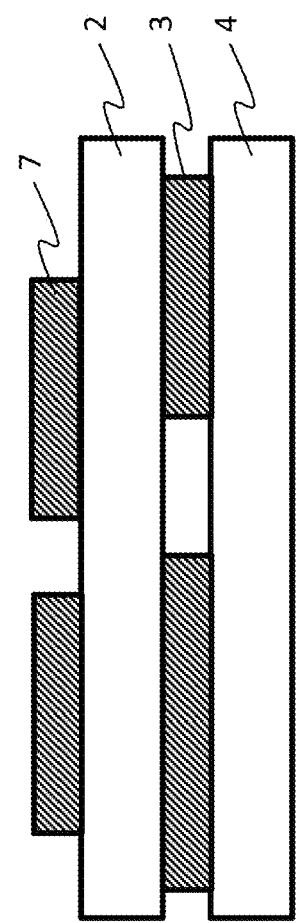

An upper face wiring pattern 7 may be disposed on an upper face of the substrate 2 positioned uppermost of the stacked multiple of substrates 2 and 4, as shown in FIG. 1B. At least one portion of the upper face wiring pattern 7 is configured of a conductive material wherein conductive particles are sintered, and a lower face of the upper face wiring pattern 7 is joined directly to the upper face of the substrate 2 positioned uppermost.

Figure 1C:
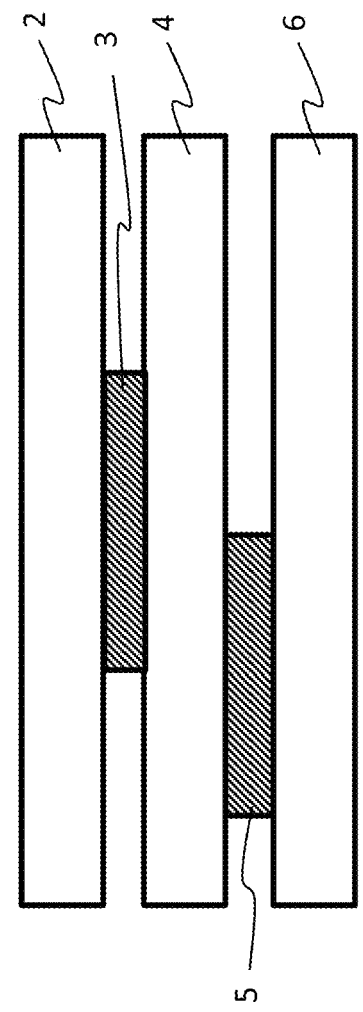

Also, there may be three or more substrates 2, 4, and 6, as shown in FIG. 1C. Each of wiring patterns 3 and 5 is disposed among the three or more substrates 2, 4, and 6, and by being joined directly to the substrates in contact above and below, the wiring patterns 3 and 5 fix the substrates above and below to each other.

Also, as shown in FIG. 2, a configuration can also be such that a through hole 20 is provided in the substrate 4 sandwiched between the two layers of wiring pattern 3 and 5, and a conductive portion 21 configured of a conductive material wherein conductive particles are sintered is packed inside the through hole 20. The conductive portion 21 is linked to each of the two layers of wiring pattern 3 and 5, thereby electrically connecting the two layers of wiring pattern 3 and 5.

As the wiring patterns 3, 5, and 7 are configured of a conductive material wherein conductive particles are sintered in this way, the multilayer circuit substrate of the embodiment can be manufactured using a simple process such that a solution wherein conductive particles are dispersed is applied and sintered. Also, as the upper face and the lower face of a wiring pattern can each be joined directly to a substrate in contact, there is no need to dispose a separate adhesive layer, and moreover, the wiring pattern can be formed by applying and sintering, because of which a thin film can be used as a substrate. Therefore, a thin multilayer circuit substrate can be realized. As one example, a film with a thickness in the region of 10 μm is used as the substrates 2, 4, and 6, and as the wiring patterns 3 and 5 can be formed to a thickness of 1 μm or less, a multilayer circuit substrate with the structure of FIG. 1C or FIG. 2 and an overall thickness of 40 μm or less can be realized.

Figure 3A:
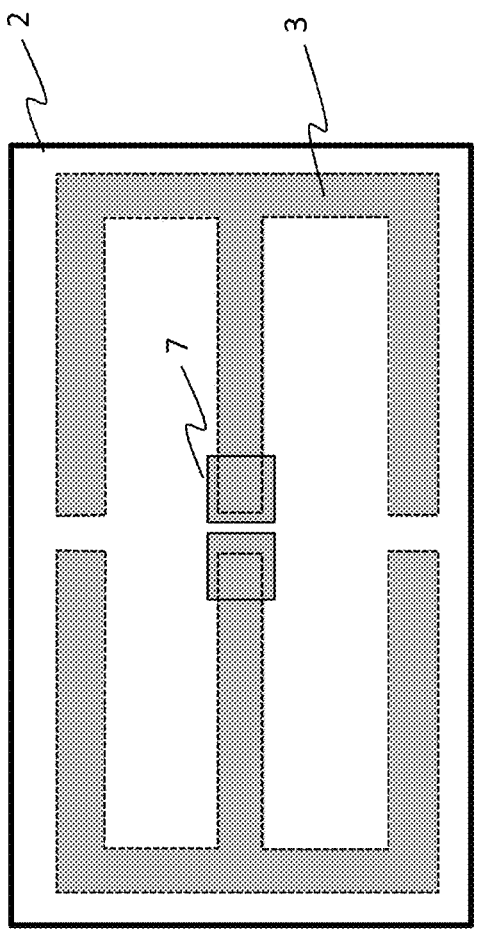
FIGS. 3A and 3B are each a top view of the multilayer circuit substrate of the first embodiment.
Figure 3B:
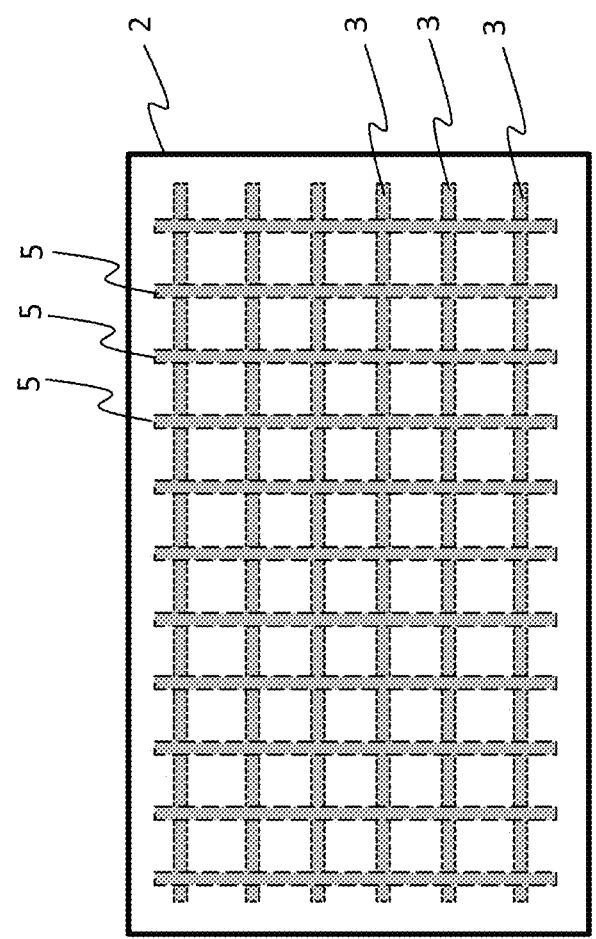

Two substrates opposed across a wiring pattern are fixed to each other by the wiring pattern, because of which routing (a pattern form) of the wiring pattern is desirably designed in accordance with a required strength. For example, FIGS. 3A and 3B are top views of the multilayer circuit substrates of FIGS. 1B and 1C respectively. By the thick wiring pattern 3 being disposed along a periphery of the substrate 2 as in FIG. 3A, the substrate 2 and the substrate 4 below the substrate 2 can be securely fixed by the wiring pattern 3. Also, by the wiring pattern 3 and the wiring pattern 5 below the wiring pattern 3 being disposed in a matrix form as in FIG. 3B, the substrates 2, 4, and 6 can be securely fixed. In the case of the configuration of FIG. 3B, the configuration can be such that an LED is mounted on the substrate 2 in a vicinity of each intersection point of the wiring pattern 3 and the wiring pattern 5, a pair of through holes 20 linked to each of the wiring pattern 3 and the wiring pattern 5 are provided, and the wiring patterns 3 and 5 are connected to LED electrodes. Because of this, the LEDs can be turned on individually by a current being selectively supplied to the matrix form wiring patterns 3 and 5.

Multilayer Circuit Substrate Manufacturing Method

Next, a method of manufacturing the multilayer circuit substrate of FIG. 1C will be described using FIGS. 4A to 4F. Herein, a manufacturing method such that a wiring pattern is formed by an ink including conductive particles and a solvent or a dispersing agent being sintered using electromagnetic waves, simultaneously with which upper and lower substrates are fixed by the wiring pattern, will be described.

Firstly, a solution (ink) in which conductive particles are dispersed is prepared, and the solution is applied in a desired form (wiring pattern form) on a surface of the substrate 6, as in FIG. 4A. As an example, a solution such that nanosized conductive particles of 1 μm or less (mean particle size) and a dispersing agent (polyvinylpyrrolidone (PVP)) are dispersed in a solvent (ethylene glycol) is used. A method such as inkjet printing, dispensing, flexography, photogravure printing, gravure offset printing, or screen printing can be used as an application method. Because of this, a film 15 of the solution (ink) is formed on the surface of the substrate 6.

Next, the solution configuring the film 15 is concentrated by heating the film 15 of the solution, causing one portion of the solvent to vaporize, thereby forming the film 15 of the concentrated solution. Specifically, a substrate 6 forming the still to be sintered film 15 after application is heated in an oven or the like, causing one portion of the solvent component of the film 15 to vaporize, whereby the film 15 having a high concentration of conductive particles with respect to the ink is formed. The heating temperature is set to be lower than a boiling point of the solvent, and is preferably a temperature of an extent that no air bubble due to heating is formed in the solvent, and of an extent that viscosity remains on an upper face of the film 15 (although differing depending on the solvent, in the region of 60° C. or higher, 250° or lower). When the solvent component of the film 15 is caused to vaporize, the ink concentration increases, because of which the film 15 is easily joined to the substrate 4 in the next step. The step of concentrating the film 15 can be also be omitted. Also, concentrated ink may be formed in advance and applied.

The substrate 4 is mounted on the film 15 of the concentrated solution in the next step of FIG. 4B. By so doing, the substrate 4 adheres (is closely attached) to the upper face of the film 15, attaining a state of being stuck.

In a step of FIG. 4C, the film 15 is heated and sintered, whereby the upper face can be joined directly to the substrate 4, and a lower face can form the wiring pattern 5 joined directly to the substrate 6.

While the film 15 is being sintered, the film 15 is in a state covered by the substrate 4, because of which the solvent vaporized from the film 15 permeates the substrates 4 and 6, or escapes into the air from a side face of the film 15. The solvent that cannot escape into the air remains as an air bubble in the wiring pattern 5 after sintering, but in the embodiment, the film 15 is concentrated before sintering, because of which the amount of solvent vaporizing is small, and an occurrence of a solvent air bubble or a crack occurring in the wiring pattern 5 after sintering can be prevented. Because of this, electrical resistance of the wiring pattern 5 after sintering can be reduced.

A heating method for sintering the film 15 of FIG. 4C may be any kind of method. For example, a method such that the whole of the film 15 and the substrates 4 and 6 are heated in a heating furnace can be used. When at least one of the substrates 4 and 6 is a substrate through which electromagnetic waves or light permeates, the film 15 can be sintered by causing electromagnetic waves or light of a wavelength that permeates at least one of the substrates 4 and 6 to permeate the substrate 4 or 6, and irradiate the film 15. A pulse wave of a light such as a flash lamp, a continuous wave such as a laser light, or an electromagnetic wave or light with a long wavelength such as a microwave, can be used as the electromagnetic wave. The electromagnetic wave or light may be such that a focused beam is radiated while scanning on the film 15, or the film 15 may be irradiated at one time without focusing, as with a flash lamp. Also, a light beam in the form of the wiring pattern 5 may be radiated by causing the light beam to permeate a mask. By so doing, conductive particles included in the film 15 can be sintered together, and the wiring pattern 5 wherein conductive particles are joined to surfaces of the substrates 4 and 6 can be formed. By using nanoparticles as the conductive particles, the conductive particles penetrate minute irregularities in the surfaces of the substrates 4 and 6, because of which an anchoring effect is obtained, and the substrates 4 and 6 and the wiring pattern 5 can be directly and securely joined.

Next, a solution (ink) in which conductive particles are dispersed is applied in the form of the wiring pattern 3 on aback face of the substrate 4, forming a film 13 of the solution, as in FIG. 4D. The film 13 is heated, causing one portion of a solvent to vaporize, thereby forming the film 13 of a concentrated solution. Next, the substrate 2 is mounted on the film 13 of the concentrated solution as in FIG. 4E, and light or electromagnetic waves are radiated as in FIG. 4F, sintering the conductive particles of the film 13 and causing the conductive particles to join surfaces of the substrates 2 and 4, thereby forming the wiring pattern 3. The steps of concentrating and sintering are carried out in the same way as the steps of FIGS. 4B and 4C.

The multilayer circuit substrate of FIG. 1C can be manufactured as heretofore described.

Heretofore, a method of manufacturing a multilayer circuit substrate in which there are two layers of wiring pattern has been described, but by repeating the steps of forming a film of a solution on a substrate, concentrating by causing one portion of a solvent to vaporize by heating the film, mounting another substrate, and sintering the film by irradiating with light or electromagnetic waves, a multilayer circuit substrate in which there are three or more layers of wiring pattern can be manufactured. Also, the step of concentrating by causing the solvent to vaporize can also be omitted.

Also, the film 15 and the film 13 may be simultaneously sintered in the step of FIG. 4F, without carrying out the step of FIG. 4C.

Also, after the film 15 is formed on the substrate 6 in the step of FIG. 4A, the film 13 may be formed on the substrate 4 before the substrate 4 is mounted on the film 15. A manufacturing process may be such that the film 15 and the film 13 are sintered simultaneously after each of the film 15 on the substrate 6 and the film 13 on the substrate 4 is concentrated, the substrate 4 is mounted on the film 15 of the substrate 6, and the substrate 2 is mounted on the film 13 of the substrate 4.

Also, a multilayer circuit substrate with the structure of FIG. 1A can be manufactured using the steps of FIGS. 4A to 4C. Also, a multilayer circuit substrate with the structure of FIG. 1B can be manufactured by sintering the upper face film 3, without mounting the substrate 2 on the film, after the steps of FIGS. 4A to 4D.

Next, a method of manufacturing the multilayer circuit substrate including a through hole of FIG. 2 will be described, using FIGS. 5A to 5F.

Figure 5A:
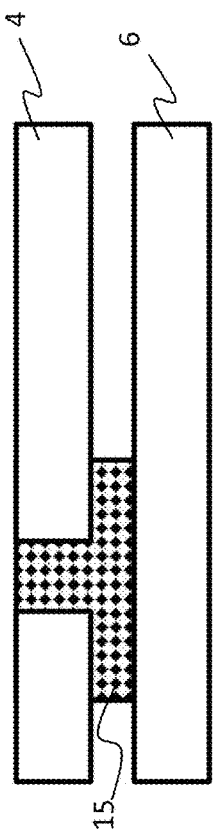
FIGS. 5A to 5F are illustrations showing a process of manufacturing the multilayer circuit substrate of FIG. 2.

As shown in FIG. 5A, a through hole is bored in a predetermined position in the substrate 4 using an arbitrary method such as pressing or laser processing, thereby forming the through hole 20. Next, a first solution wherein conductive particles are dispersed in a solvent is applied from the surface side of the substrate 4 using screen printing or the like, filling the interior of the through hole 20. By so doing, a filling portion 121b formed of the first solution is formed in the through hole 20, together with which the first solution is applied in the form of the wiring pattern 5, forming the film 15 of the first solution. Nanoparticles with a diameter (mean particle size) of less than 1 μm are preferably used as the conductive particles of the first solution in order to cause volumetric shrinkage of the filling portion 121b when sintering.

Next, the solution configuring the film 15 and the filling portion 121b is concentrated by heating the film 15 of the first solution and the filling portion 121b, causing one portion of the solvent to vaporize.

Next, the substrate 4 is inverted as in FIG. 5B, orienting the film 15 of the concentrated solution downward, the substrate 6 is disposed below the film 15, and the substrate 6 is closely attached to a surface of the film 15.

Figure 5C:
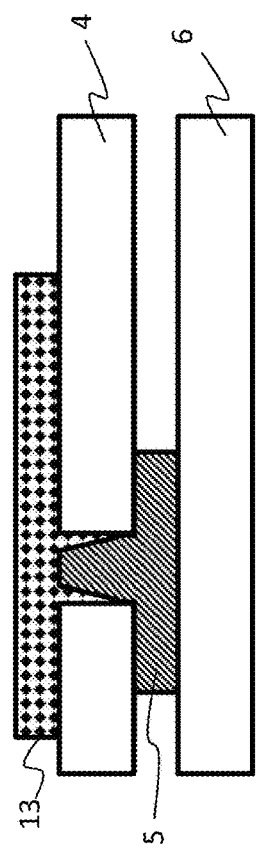
Figure 5E:
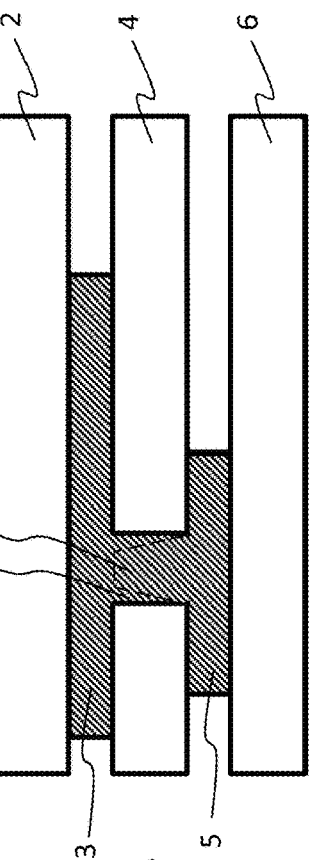
Figure 5B:
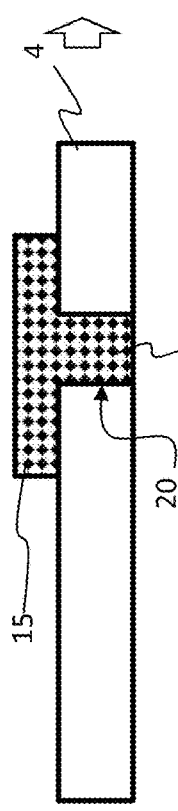

Continuing, the film 15 of the first solution and the filling portion 121b are heated using a heating furnace, irradiation with electromagnetic waves or light, or the like, in a step of FIG. 5C, thereby sintering the conductive particles in the solution. Owing to the sintering, the solvent included in the solution vaporizes, and the conductive particles are sintered together (fused), because of which the filling portion 121b separates from an inner wall of the through hole 20 and volumetrically shrinks toward a center, forming a pillar portion 21b. Because of this, a gap 19 is formed between the inner wall of the through hole 20 and the pillar portion 21b. Also, by being sintered, the film 15 forms the wiring pattern 5 continuous with the pillar portion 21b.

Figure 5D:
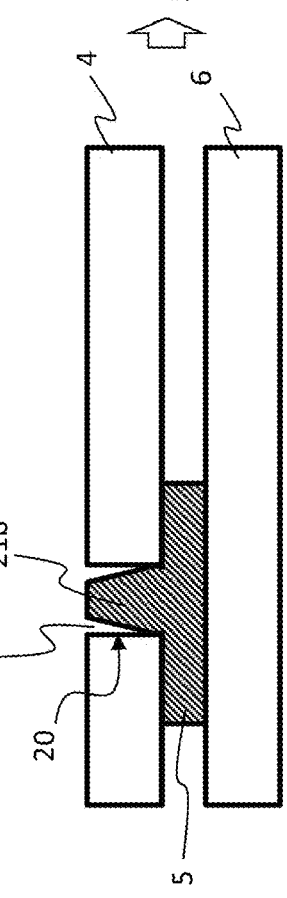

Next, a second solution wherein conductive particles are dispersed in a solvent is applied from a face of the substrate 4 on the side opposite to the side on which the wiring pattern 5 is formed, filling the gap 19 in the through hole 20, as in FIG. 5D. Because of this, a second filling portion 121a formed of the second solution, and the film 13 formed of the second solution, are formed. The second solution may be the same as the first solution. Also, unlike the filling portion 121b, there is no need to cause volumetric shrinkage of the second filling portion 121a, because of which a second solution with a higher ratio of conductive microparticles than the first solution may be used.

Next, the film 13 and the second filling portion 121a are heated, causing one portion of the solvent to vaporize, whereby the film 13 of a concentrated solution and the second filling portion 121a are formed. Next, the substrate 2 is mounted on the film 13 of the concentrated solution, as in FIG. 5E.

Figure 5F:
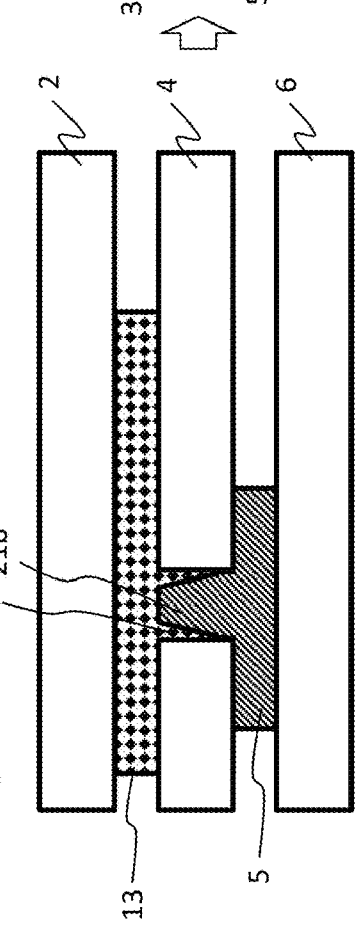

In a step of FIG. 5F, the conductive particles of the film 13 are sintered, and caused to join the surfaces of the substrates 2 and 4, using a heating furnace, irradiation with light or electromagnetic waves, or the like, thereby forming the wiring pattern 3. Simultaneously with this, the second filling portion 121a is sintered, whereby a depressed portion 21a is formed in a gap between the inner wall of the through hole 20 and the pillar portion 21b. The depressed portion 21a volumetrically shrinks toward the center of the through hole 20, because of which the depressed portion 21a is securely joined to the pillar portion 21b, configuring a conductive portion 21. Junction faces of the pillar portion 21b and the depressed portion 21a are practically integrated by the sintering, because of which a practically integrated conductive portion 21 is formed. Moreover, a contact area between the pillar portion 21b and the depressed portion 21a is greater than when both are of a pillar form, and the two can be securely joined. Also, the wiring pattern 3 forms a film continuous with the depressed portion 21a owing to the sintering. Therefore, the wiring pattern 3, the conductive portion 21, and the wiring pattern 5 forma continuous structure, there is little possibility of through hole disconnection occurring, and electrical continuity reliability is high.

Second Embodiment

A multilayer circuit substrate of a second embodiment will be described, using FIG. 6A.

As shown in FIG. 6A, the multilayer circuit substrate of the second embodiment has three or more substrates, and of the stacked three or more substrates, the two substrates 2 and 6 are larger than other substrates 4-1, 4-2, and 4-3 sandwiched between the substrates 2 and 6. The larger two substrates 2 and 6 have regions that are directly opposed with no intervention of the other substrates 4-1, 4-2, and 4-3, and an electronic part 61 is mounted in these regions. As other structures are of a configuration the same as in FIG. 1C and the like of the first embodiment, a description will be omitted.

The electronic part 61 is of a configuration including an upper face electrode on an upper face and a lower face electrode on a lower face, and the upper face electrode and the lower face electrode are connected respectively to the wiring patterns 3 and 5 joined to the larger two substrates 2 and 6.

In this way, the multilayer circuit substrate of the second embodiment is of a configuration such that an electronic part is disposed between substrates configuring the multilayer circuit substrate.

The second embodiment not being limited to the structure wherein the two substrates 2 and 6 are larger than the other substrates 4-1 and the like, a configuration wherein the electronic part 61 is sandwiched between substrates neighboring in a vertical direction can also be adopted, as in FIGS. 6B and 6C. In this case, a structure may be such that the electronic part 61 includes an upper face electrode and a lower face electrode, and the electrodes are joined respectively to wiring patterns 40-2 and 5 connected to upper and lower substrates 4-2 and 6, as in FIG. 6B. Also, a structure may be such that the electronic part 61 has a pair of lower face electrodes, each of the pair of lower face electrodes is joined to the wiring pattern 5 of the substrate 6 below, and the upper face of the electronic part 61 is bonded to the substrate 4-2 by an adhesive or the like as in FIG. 6C.

A method of manufacturing the multilayer circuit substrate of FIG. 6A will be described, using FIGS. 7A to 7D.

Firstly, the electronic part 61 is fixed across the wiring pattern 5 in a predetermined region of the substrate 6, as in FIG. 7A. Specifically, in the same way as in the steps of FIGS. 4A and 4B, a solution wherein conductive particles are dispersed in a solvent is applied in the form of the predetermined wiring pattern 5 on the substrate 6, after which a film is concentrated, and the electronic part 61 is mounted instead of the substrate 4 of FIG. 4B, whereby the film and the lower electrode of the electronic part are closely attached, and the film is subsequently sintered.

Next, the steps of FIGS. 4A to 4F are carried out in a region of the substrate 6 in which the electronic part 61 is not mounted, whereby the substrates 4-3, 4-2, and 4-1 are stacked and fixed sandwiching wiring patterns 5, 40-2, and 40-1, as in FIG. 7B.

Next, the film 13 is applied in two places on the surface of the substrate 2 and subsequently concentrated, and with the film 13 oriented downward, the film 13 is mounted so as to adhere to the upper face of the electronic part 61 and an upper face of the substrate 4-1, as in FIG. 7C.

By sintering the film 13 in the same way as in FIG. 4F, the substrate 2 is fixed to the electronic part 61 and the substrate 4 by the wiring pattern 3, as in FIG. 7D. The multilayer circuit substrate of FIG. 6A can be manufactured using the heretofore described steps.

Third Embodiment

A multilayer circuit substrate of a third embodiment will be described, using FIG. 8.

A multilayer circuit substrate of FIG. 8 is such that an electrode of an LED die 81 is joined as a light source to the upper face wiring pattern 7 of a multilayer circuit substrate with the structure of FIG. 1B. A half mirror 82 formed of a metal layer or the like is disposed on a lower face of the substrate 2. A mirror 83 formed of a metal layer or the like is disposed on a lower face of the substrate 4. Also, the substrates 2 and 4 transmit light emitted by the LED die 81.

A multilayer circuit substrate with this kind of structure is such that when power is supplied from the wiring pattern 7 to the LED die 81, the LED die 81 emits light. Light emitted from an upper face and a side face of the LED die 81 is emitted unchanged. Light emitted downward from the LED die 81 permeates the substrate 2, and one portion is reflected by the half mirror 82 on the lower face of the substrate 2, and emitted upward from the upper face of the substrate 2. Also, light that permeates the half mirror 82 falls incident on the substrate 4, is reflected upward by the mirror 83 on the lower face of the substrate 4, and reaches the half mirror 82 again, where one portion is reflected and one portion permeates. Therefore, as in FIG. 8, one portion of light is propagated in an in-plane direction of the substrate 4 while being repeatedly reflected between the half mirror 82 and the mirror 83, and of this one portion of light, one portion permeates the half mirror 82 and is emitted upward.

Therefore, light is emitted from the whole of the upper face of the multilayer circuit substrate, because of which the multilayer circuit substrate of the embodiment can be utilized as a surface light source or the like. The LED die 81 is small, and the wiring pattern 7 can also be formed to have a minute wire width, because of there is no great impediment to light reflected by the half mirror 82 and the mirror 83 and emitted upward from the substrate 2.

Also, surface light sources of differing reflectance properties or reflection wavelengths can be provided by designing a transmission property of the half mirror 82 to be a desired value, or stacking a color filter on the half mirror 82.

Although the LED die 81 is used as a light source here, an LED enclosed in a package can also be used.

Hereafter, a material and the like of each portion of the multilayer circuit substrate of the first to third embodiments will be described.

Solution Including Conductive Particles A description will be given of the solution (ink) including conductive minute particles used in the steps of forming the wiring pattern 3, the conductive portion 21, and the like in the first to third embodiments.

One or more of conductive metals and conductive metal oxides such as gold (Au), silver (Ag), copper (Cu), palladium (Pd), indium tin oxide (ITO), nickel (Ni), platinum (Pt), or iron (Fe) can be used for the conductive particles.

A diameter of the conductive particles (mean particle size) may be such that only nanoparticles of less than 1 μm are used, or nanoparticles of less than 1 μm and microparticles of 1 μm or more may be mixed. As one example, the size of a nanoparticle is 10 to 150 nm.

An organic solvent such as alcohol or glycol, or water, is preferably used as the solvent of the solution.

In addition to the conductive particles, a dispersing agent (for example, a polymer component such as polyvinylpyrrolidone (PVP) or an amine) that increases dispersibility of the conductive particles may be added to the solution.

Also, a resin component (an epoxy, silicone, urethane, or the like) may be added to the solution in order to increase adhesive strength.

Note that in order to cause volumetric shrinkage, the first solution used for forming the conductive portion 21 (the pillar portion 21b and the depressed portion 21a) in the manufacturing steps of FIGS. 5A to 5F in the first embodiment desirably does not include a resin component (an epoxy, silicone, urethane, or the like) that increases adhesive strength. Also, when there is too much dispersing agent in the first solution, volumetric shrinkage decreases, because of which the dispersing agent is desirably added at a concentration low enough not to impede dispersion.

Also, in order to cause volumetric shrinkage when sintering, preferably only nanoparticles are used for the conductive particles used in the first solution, but microparticles with a diameter (mean particle size) of 1 μm or more, 100 μm or less may also be included as one portion. Although the volumetric shrinkage rate decreases due to microparticles being included, the conductive particles are more easily sintered with the form (pillar form) of the first solution unchanged. For example, the ratio of the conductive particles included in the first solution that is nanoparticles with a diameter of less than 1 μm is preferably 40% by weight or greater, 100% by weight or less, more preferably 70% by weight or greater, 100% by weight or less, and more preferably still 75% by weight or greater, 100% by weight or less.

Also, when the ratio of conductive particles in the first solution is too low, sintering the conductive particles with the form of the first solution unchanged becomes difficult, and forming the pillar portion 21b becomes difficult. Because of this, the ratio of conductive particles in the first solution is preferably 50% by weight or greater, 98% by weight or less, more preferably 60% by weight or greater, 95% by weight or less, and more preferably still 80% by weight or greater, 95% by weight or less.

Meanwhile, the ratio of the conductive particles included in the second solution for forming the depressed portion 21a that is nanoparticles with a diameter of less than 1 μm is preferably greater than 0% by weight and 100% by weight or less, more preferably greater than 0% by weight and 90% by weight or less, and more preferably still greater than 0% by weight and 80% by weight or less.

Also, the ratio of conductive particles in the second solution is preferably 50% by weight or greater, 98% by weight or less, more preferably 60% by weight or greater, 95% by weight or less, and more preferably still 80% by weight or greater, 95% by weight or less.

Conductive Particle Light Sintering Mechanism A mechanism whereby conductive particles irradiated with light are sintered when light-sintering the films 13 and 15 and the filling portions 121a, 121b will be described further. The temperature of a region of the films 13 and 15 irradiated with light rises owing to the conductive particles absorbing energy from the light. Because of this, the conductive particles fuse at a temperature lower than a fusing point of a bulk of the material configuring the particles, and the fused conductive nanoparticles are sintered by fusing directly with neighboring particles in accompaniment to the rise in temperature of the conductive particles, whereby the wiring pattern 3 and the like are formed. At this time, the fused conductive particles adhere to the substrate, because of which the wiring pattern can be joined directly to the substrate without using an adhesive or the like.

Heat of the conductive particles irradiated with light is transmitted to a peripheral film and substrate and dissipated, because of which a rise in temperature of a film or substrate in a region that is not irradiated with light is restricted. Therefore, a change in quality such as substrate deformation or distortion, or clouding, can be prevented. Also, when a substrate is flexible, the flexibility can be maintained. Note that as a light irradiation method, the whole substrate can also be irradiated with a flashing light or the like, thereby sintering the film.

Porosity

The wiring pattern 3 and the like are desirably formed so to be porous. That is, electromagnetic wave sintering is desirably carried out at a temperature such that neighboring conductive particles are sintered at an interface at which the particles are in contact, rather than the particles mixing by the whole of the particles being completely fused, and a void is formed in at least one portion between the conductive particles after sintering.

When the wiring pattern is porous, the wiring pattern 3 itself has plasticity, because of which, even when a flexible substrate is caused to transform, the wiring pattern also transforms in accompaniment. Therefore, the wiring pattern is unlikely to separate from the substrate, and cracking or the like is unlikely to occur, because of which a flexible multilayer circuit substrate wherein disconnection is unlikely to occur can be provided.

Light Wavelength

A wavelength absorbed by the conductive particles is used as the wavelength of the radiated light. For example, any of ultraviolet, visible, or infrared light may be used, or a microwave light may be used. For example, when using silver (Ag), copper (Cu), gold (Au), palladium (Pd), or the like for the conductive particles, visible light in the region of 400 to 600 nm can be used.

Wiring Pattern Size

Also, in order to reduce electrical resistance, the wiring pattern 3 is desirably of a structure such that a proportion of thickness with respect to width is large. For example, the proportion of thickness with respect to width of the wiring pattern 3 is such that thickness to width=1 to 100 or greater is desirable, thickness to width=5 to 100 or greater is more desirable, and thickness to width=10 to 100 or greater is particularly desirable. Also, when a large current is to be supplied to the wiring pattern 3, thickness to width=20 to 100 or greater is desirable. Also, the thickness of the wiring pattern 3 being greater than the width is still more desirable.

As one example, the size of the wiring pattern 3 is such that the width is formed to be 1 μm or greater, and the thickness is formed to be in the region of 1 nm to 50 μm. Also, electrical resistivity of the wiring pattern 3 is such that $10^{-4}$ Ω·cm or less is desirable, and electrical resistance in the order of $10^{-6}$ Ω·cm is particularly desirable.

Substrate

In the embodiment, a thin substrate or film with a thickness in the region of, for example, 10 to 1,000 μm can be used as the substrates 2, 4, 6, and the like. A material based mainly on an organic component such as glass, polystyrene (PS), polypropylene (PP), a polycarbonate (PC), polyethylene terephthalate (PET), polyethylene naphthalate (PEN), a polyimide, an acryl, an epoxy, or silicone, or the like, can be used as a substrate material.

When light is used as a heating method when sintering the conductive particles, a substrate that transmits light of the relevant wavelength is used, but when heating without using light, the substrate need not be transparent.

In order to improve adhesion between a substrate and a wiring pattern, surface treatment may be performed on the substrate. For example, a plasma processing, an ultraviolet (UV) processing, or a process of applying a coupling agent or the like, is carried out.

The multilayer circuit substrate of the first to third embodiments is such that thickness can be reduced, because of which the multilayer circuit substrate is appropriate for use as a device in which circuit substrates need to be disposed at a high density in a small space, for example, a control circuit substrate in an automobile, a display circuit substrate, or a backlight. Also, a transparent, and moreover, flexible multilayer circuit substrate can be provided, because of which the multilayer circuit substrate is also appropriate as, for example, a display device used affixed to an automobile front windshield, rear windshield, or the like.

Also, in addition to this, the multilayer circuit substrate can also be appropriately used for a lighting instrument (point emission or surface emission lighting, flexible lighting, automotive lighting (interior or exterior), and the like), a display instrument (a see-through display or a wearable display), a performance device (performance lighting, a display, or the like for a game machine such as pachinko), or the like.

What is claimed is:

1. A multilayer circuit substrate manufacturing method, comprising:

applying, in a desired form, a first solution in which conductive particles are dispersed on an upper face of a first substrate, thereby forming a first film;

mounting a second substrate on the first film, and causing a lower face of the second substrate to adhere to an upper face of the first film;

applying, in a desired form, a second solution in which conductive particles are dispersed, on an upper face of the second substrate, thereby forming a second film; and mounting a third substrate on the second film, and causing a lower face of the third substrate to adhere to an upper face of the second film; and simultaneously sintering the first film and the second film, after causing the lower face of the third substrate to adhere to the upper face of the second film, thereby simultaneously forming a first wiring pattern and a second wiring pattern, wherein a lower face of the first wiring pattern is joined directly to the first substrate and an upper face of the first wiring pattern is joined directly to the second substrate, and wherein a lower face of the second wiring pattern is joined directly to the second substrate and an upper face of the second wiring pattern is joined directly to the third substrate.

* * * * *